(12) United States Patent
Lachner et al.

(10) Patent No.: US 6,774,425 B2
(45) Date of Patent: Aug. 10, 2004

(54) METAL-INSULATOR-METAL CAPACITOR AND A METHOD FOR PRODUCING SAME

(75) Inventors: Rudolf Lachner, Ingolstadt (DE); Michael Schrenk, Diessen am Ammersee (DE); Markus Schwerd, Holzkirchen (DE)

(73) Assignee: Infineon Technologies AG, Münich (DE)

( * ) Notice: Subject to any disclaimer, the term of this patent is extended or adjusted under 35 U.S.C. 154(b) by 0 days.

(21) Appl. No.: 10/221,010
(22) PCT Filed: Mar. 6, 2001
(86) PCT No.: PCT/EP01/02511
§ 371 (c)(1), (2), (4) Date: Oct. 15, 2002
(87) PCT Pub. No.: WO01/67522
PCT Pub. Date: Sep. 13, 2001

(65) Prior Publication Data
US 2003/0052335 A1 Mar. 20, 2003

(30) Foreign Application Priority Data
Mar. 6, 2000 (EP) .............................................. 00104821

(51) Int. Cl.[7] ......................... H01L 27/108; H01L 29/76
(52) U.S. Cl. ....................................... 257/306; 257/758
(58) Field of Search ................................... 257/306, 758

(56) References Cited

U.S. PATENT DOCUMENTS 6,136,640 A 10/2000 Marty et al.
6,175,131 B1 * 1/2001 Adan .......................... 257/306
6,569,746 B2 * 5/2003 Lee et al. .................... 438/398

FOREIGN PATENT DOCUMENTS

EP 0 800 217 A1 10/1997
EP 0 892 442 A1 1/1999

OTHER PUBLICATIONS

Arjun Kar–Roy et al, "High Density Metal Insulator Metal Capacitors Using PECVD Nitride for Mixed Signal and RF Circuits", *International Interconnect Technologies Conference*, San Francisco, CA, May 24, 1999, pp. 245–247.

* cited by examiner

Primary Examiner—David Nelms
Assistant Examiner—Tu-Tu Ho
(74) Attorney, Agent, or Firm—Schiff Hardin LLP

(57) ABSTRACT

A capacitor stack in a layer structure of an integrated component has the same layer sequence as an adjacent interconnect, with the exception of a dielectric interlayer. This significantly facilitates the fabrication of vias.

16 Claims, 3 Drawing Sheets

METAL-INSULATOR-METAL CAPACITOR AND A METHOD FOR PRODUCING SAME

This application is a national phase application under 35 U.S.C. § 371 of International Application No. PCT/EP01/02511, filed Mar. 3, 2001.

BACKGROUND OF THE INVENTION

The invention relates to an integrated component with a multiplicity of interconnects and a capacitor with the capacitor having a first electrode, a dielectric interlayer and a second electrode.

The invention also relates to a method for fabricating an integrated component of this type.

The article by Aryon Kar-Roy et al., "High Density Metal Insulator Metal Capacitor Using PECVD Nitride for Mixed Signal and RF Circuits", *International Interconnect Technologies Conference*, 1999, pp. 245 to 247, has disclosed a semiconductor structure in which the metal-insulator-metal capacitor is formed by a first metal layer, a dielectric interlayer and an intermediate metal layer. The intermediate metal layer is connected to a second metal layer through vias. The first and second metal layer also form the interconnects by which the passive components in the layer structure are connected to one another. Accordingly, the first metal layer and the second metal layer run at substantially the same level over the entire cross section of the semiconductor structure. However, the extent of the intermediate metal layer, which forms one of the electrodes of the capacitor, is locally limited and this layer is arranged at a level between the first and second metal layers.

To fabricate the known layer structure, a layer of either Ti or TiN is first applied to the first metal layer, which comprises aluminum and which forms the first electrode of the capacitor. Then, the dielectric interlayer, which, for example comprises either $SiO_2$ or SiN, is deposited on the layer of Ti or TiN. Then a layer of either Ti or TiN, the intermediate metal layer of aluminum and a further layer of either Ti or TiN, which serves as an antireflection layer, are applied in that order. These layers are applied to the entire surface. To pattern the second metal layer which forms the second electrode, a photoresist is applied to the antireflection layer and exposed. Then, etching is carried out, stopping in the dielectric interlayer. This is followed by patterning of the first metal layer below the dielectric layer, which metal layer forms the first electrode. For this purpose, once again a photoresist is applied, exposed and then the first metal layer is etched. This results in the formation of a layer structure with a capacitor, the first electrode of which is formed by the first metal layer and the second electrode of which is formed by the intermediate metal layer.

A drawback of the known layer structure and of the method for its fabrication is that it is difficult to produce vias between the intermediate metal layer and the second metal layer, since in this process step it is expedient for the vias between the interconnects in the first metal layer and the interconnects of the second metal layer also to be produced. However, the vias between the intermediate metal layer and the second metal layer are less deep than the vias between interconnects in the first metal layer and interconnects of the second metal layer. Consequently, the intermediate metal layer has to be effectively protected by means of an etching stop. However, this cannot always be achieved. Accordingly, the intermediate metal layer and therefore the capacitor are often destroyed.

SUMMARY OF THE INVENTION

Working on the basis of the prior art, the invention is based on the object of providing an integrated component having a metal-insulator-metal capacitor which is easy to fabricate and of providing a method for its fabrication.

This object is achieved by an integrated component having a multiplicity of interconnects and a capacitor which has a first electrode, a dielectric interlayer and a second electrode, with an improvement of the electrodes of the capacitor including a layer sequence which is identical to the layer sequence of the closest interconnect.

The object is also achieved by a method for fabricating an integrated component, which has a capacitor with a metal-insulator-metal layer sequence and interconnects. The method comprises the steps of depositing a first layer sequence for a first electrode of the capacitor, depositing a dielectric interlayer on the first layer sequence; etching to pattern the first layer sequence and the dielectric interlayer to form the first electrode and the insulator with the etching stopping in the first layer sequence; depositing a second layer sequence for a second electrode of the capacitor; and etching the second layer sequence to pattern the second layer sequence to form the second electrode and the interconnects.

Since the electrodes of the capacitor together have substantially the same layer sequence as the layer sequence of the closest interconnect, the layer sequence in the region of the capacitor differs only through the dielectric interlayer from the layer sequence in the region of the interconnects. Consequently, the vias between the second electrode and a metal layer above it and the vias between the adjacent interconnect and the metal layer above it are of substantially the same length. Moreover, the thickness of the electrodes approximately corresponds to the thickness of an interconnect. However, interconnects usually have a very high thickness compared to other layers. Since, in the subject matter of the invention, the electrodes are of approximately the same thickness as an interconnect, it is not disadvantageous if the second electrode is partially etched when the vias are being etched out. This is because their great thickness means that the remaining second electrode still has a thickness which is sufficient for it to function. For these reasons, the second electrode also does not have to be protected by an effective etching stop when the passages of the vias are being etched.

The fabrication method for fabricating the capacitor is expediently managed in such a way that first of all the lower, first electrode and the dielectric interlayer are deposited and patterned. The layers required in order to form the second electrode can be applied to the lower, first electrode formed in this way. Finally, after these layers have been patterned, the result is a capacitor whose electrodes together have the same layer sequence as an interconnect which has been formed together with the capacitor. As has already been mentioned, this significantly facilitates the production of the vias between the second electrode and a metal layer above it and between adjacent interconnects and the metal layer above them.

Expedient configurations of the invention form the subject matter of the dependent claims.

The text which follows explains an exemplary embodiment of the invention in detail with reference to the appended drawing.

DESCRIPTION OF THE PREFERRED EMBODIMENTS

FIGS. 1 to 4 illustrate cross sections through the integrated component which is being fabricated, at various points in time.

Figure 1:
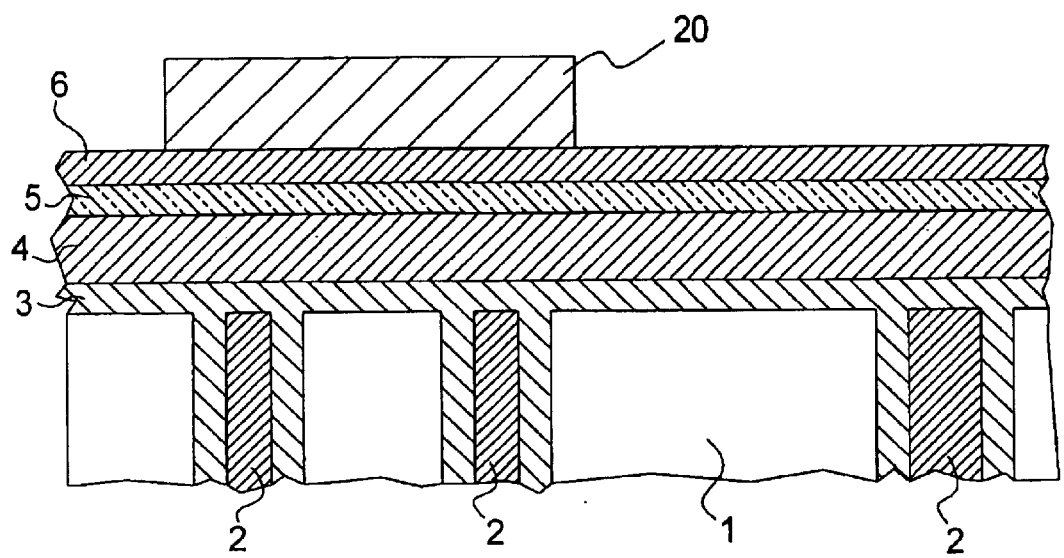
FIG. 1 is a cross-sectional view through a layer structure before patterning to form the first electrode.
Figure 2:
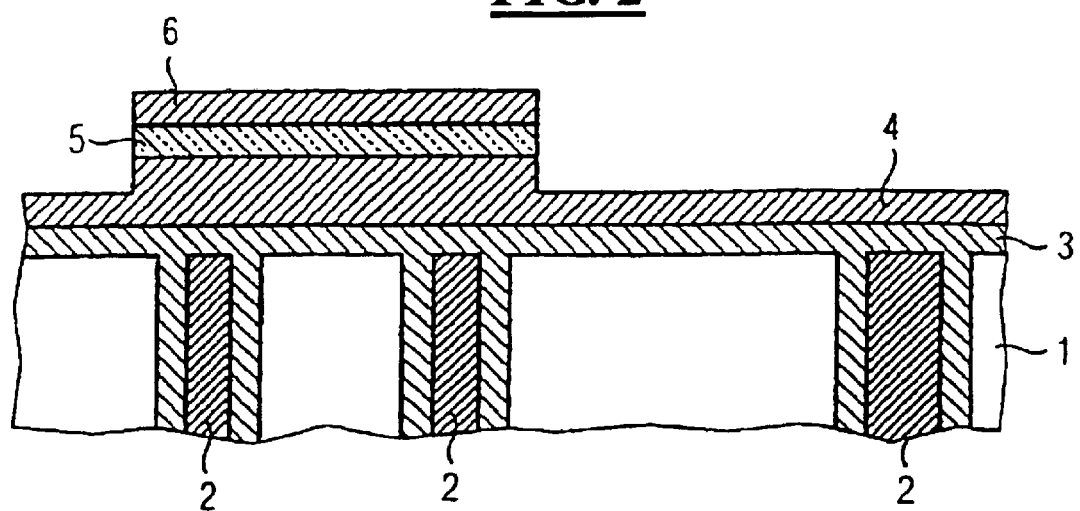
FIG. 2 is a cross-sectional view through a layer structure in which the first electrode has already been patterned.
Figure 3:
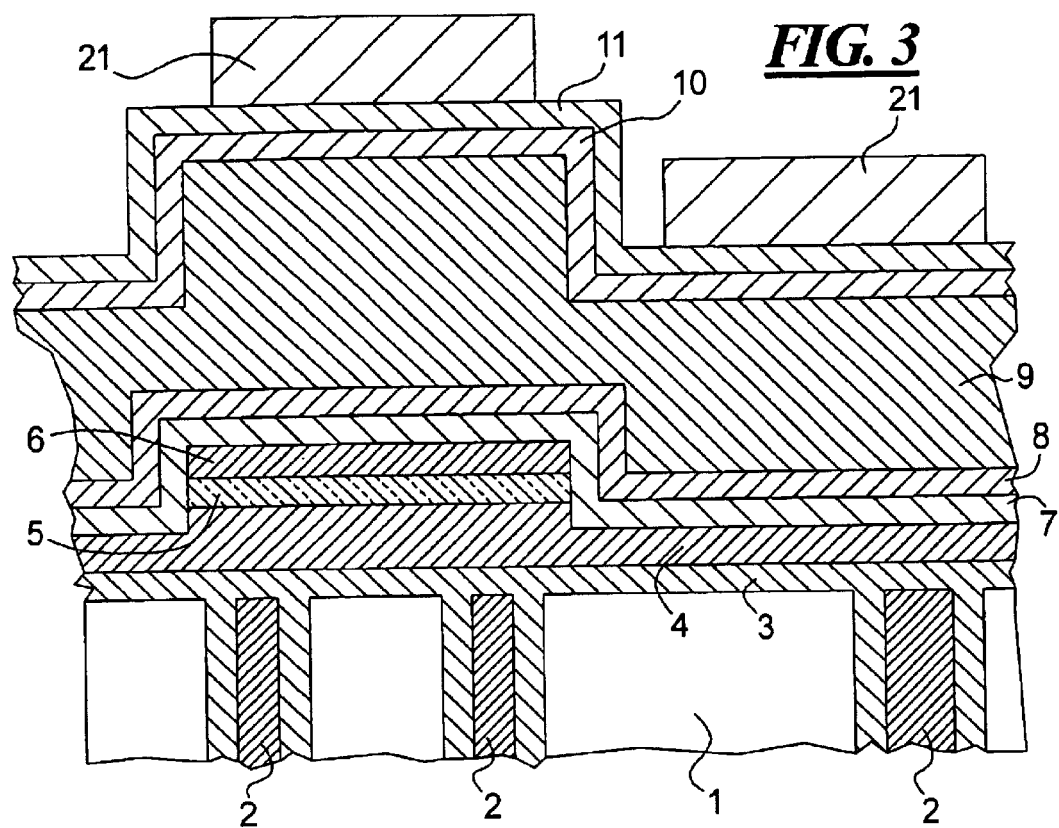
FIG. 3 is a cross-sectional view through a layer structure before patterning the second electrode.
Figure 4:
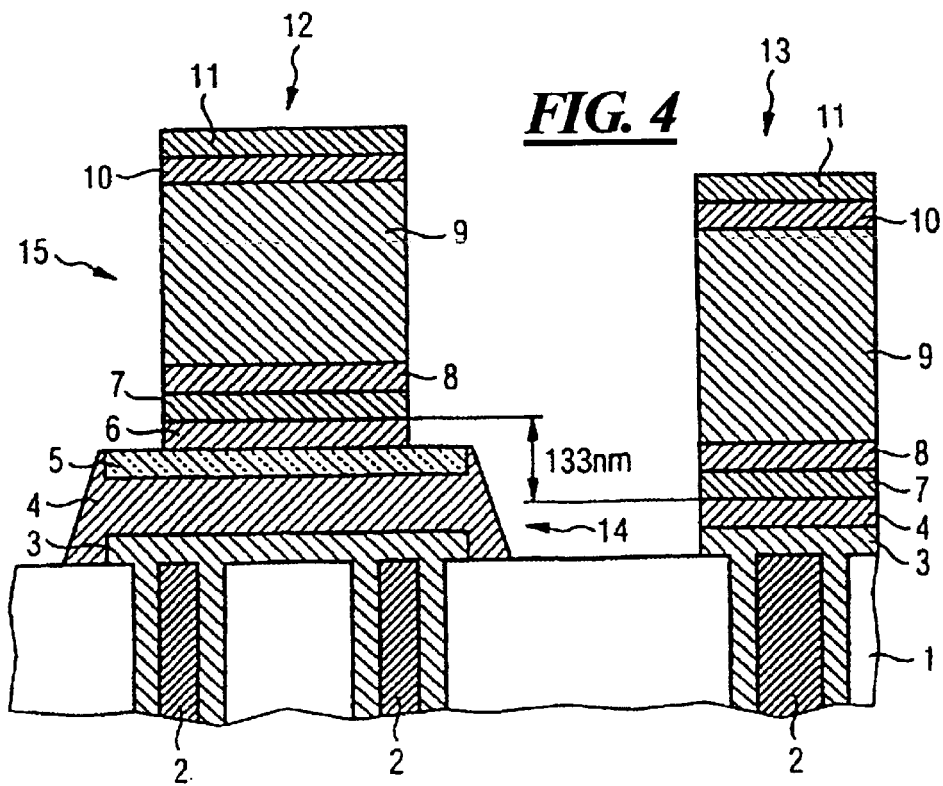
FIG. 4 is a cross-sectional view through a layer structure in which the second electrode has already been patterned.

FIG. 1 illustrates a cross section through a region of the integrated component in which a capacitor is to be formed. For this purpose, a first metalization layer 3 is applied to the entire surface of an interlayer dielectric 1, which has vias 2. The vias 2 lead to a first metal layer, which is not shown in FIG. 1, which layer is arranged below the interlayer dielectric 1 and which has interconnects formed therein. Then, a first getter layer 4, which serves as a diffusion barrier, a dielectric interlayer 5 and an antireflection layer 6 are applied sequentially to the entire surface of the first metalization layer 3. In order for the dielectric interlayer 5 to be patterned, the antireflection layer 6 is provided with a photoresist which is then exposed and developed to form a mask 20. This is followed by an etching operation which stops in the first getter layer 4 (see FIG. 2). Then, the mask 20 on the antireflection layer 6 is removed, and the antireflection layer 6 protects the dielectric interlayer. Then, a second getter layer 7, a first antidegradation layer 8, a second metal layer 9, a second antidegradation layer 10 and a second antireflection layer 11 are applied to the entire surface with a mask 21 of a photoresist (see FIG. 3). This is followed by patterning with the aid of the mask 21 on the second antireflection layer 11 and subsequent etching, stopping at the interlayer dielectric 1. This results in the formation of a capacitor stack 12 and an adjacent interconnect 13, which are illustrated in FIG. 4. The interconnect 13 is supposed to be the closest interconnect. The capacitor stack 12 includes a capacitor, which has a first electrode 14 comprising the first metalization layer 3 and the first getter layer 4. The antireflection layer 6, the second getter layer 7, the first antidegradation layer 8, the second metal layer 9, the second antidegradation layer 10 and the second antireflection layer 11, on the other hand, form the second electrode 15. Between the first electrode 14 and the second electrode 15 is the dielectric interlayer 5. As seen from the dielectric interlayer 5, the capacitor stack 12 therefore has the same layer sequence as the adjacent interconnect 13.

Figure 5:
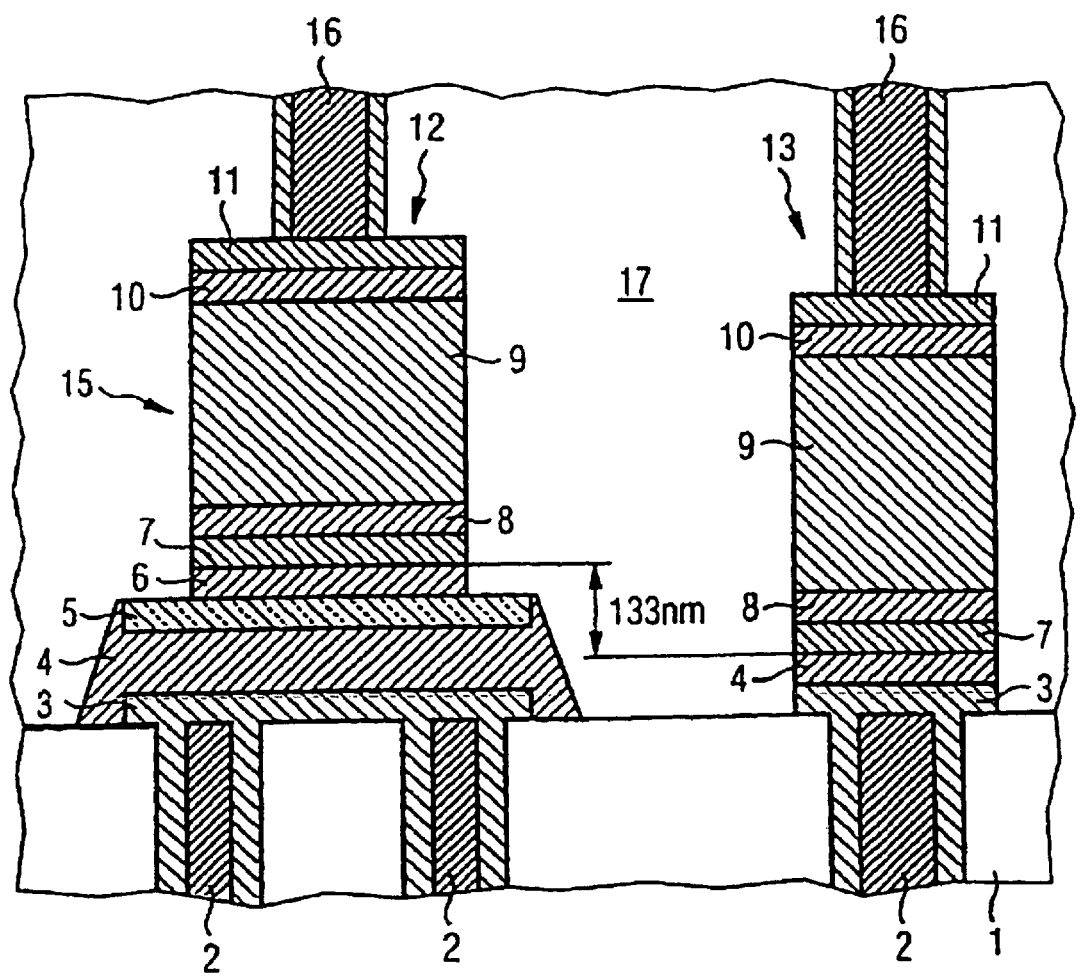
FIG. 5 is a cross-sectional view through the finished layer structure.

After the capacitor stack 12 and the interconnect 13 have been formed, they are both embedded in a second interlayer dielectric 17, which is illustrated in FIG. 5. The unevenness which forms on the surface of the second interlayer dielectric 17 is then leveled. Next, vias 16, which are intended to connect the second electrode 15 to a third metal layer (not shown in FIG. 5) and above the dielectric layer 17, are then formed in the second interlayer dielectric 17. Vias 16 which connect the interconnect 13 to the third metal layer may also be formed for connection of the interconnect 13. Since the vias 16 are of approximately the same depth, there is no need for any special precautions in order to protect the second electrode 15 from the etching medium while the passages for the vias 16 are being etched out. The considerable layer thickness of the second metal layer 9 also contributes to this, since even if the etching medium does penetrate into the second metal layer 9 in the capacitor stack 12, the second metal layer 9 is nevertheless sufficiently thick so that it is not to be completely destroyed. Therefore, the second electrode 15 is also not at risk from an etching operation which does not take place correctly.

Another advantage is the spatial distance from the metal layer which lies below the first interlayer dielectric 1 and is not shown in FIGS. 1 to 5 to the first electrode 14, since unevenness which warps a dielectric interlayer may occur on the first metal layer if the dielectric interlayer is applied directly to the first metal layer, which is the case if the first metal layer is used as the electrode. The layer structure illustrated in FIGS. 1 to 5 differs from this arrangement which is known from the prior art in that the first metal layer and first electrode 14 are spatially separate. Since the first electrode 14 is applied to a surface of the interlayer dielectric 1 which has been leveled, for example by chemical mechanical polishing, the first electrode 14 is substantially flat. The same applies to the dielectric interlayer 5 which has been applied to the first electrode 14. Therefore, the layer structure presented here preserves the planarity of first electrode 14, dielectric layer 5 and second electrode 15 in a particular way.

An additional advantage is to be seen in the complete removal of the dielectric layer 5 outside the capacitor stack 12. Unlike the layer structure presented here, in the prior-art residues of the dielectric interlayer which has been applied to the entire surface remain in place outside the capacitor stack 12, since the dielectric interlayer is used as an etching stop. In the prior art, the residues of the dielectric interlayer lead to stresses on account of different expansion coefficients between residues of the dielectric interlayer and the immediately adjoining metal layers below it. These occur in particular after heat treatments and have an adverse effect on reliability, since these stresses may become so great that cracks or dislocations occur. By contrast, in the layer structure shown in FIGS. 1 to 5 and the method for its fabrication, the dielectric interlayer 5 is not used as an etching stop and is completely removed outside the capacitor stack 12. Accordingly, there is no risk of the layers above it warping. Moreover, it is also possible to use materials with a high dielectric constant of >50, such as for example $Ta_2O_5$, $Bi_2Sr_3TiO_3$ or $Ba_xSr_{1-x}TiO_3$, where $0 \leq x \leq 1$ for the interlayer 5. Since the residues of the dielectric interlayer are completely removed outside the capacitor stack 12, there is no risk of residues of these materials increasing the stray capacitance between the interconnects in the first metal layer and the second metal layer 9. The materials with a high dielectric constant can be used even if their etching characteristics are not completely known, since because the dielectric interlayer 5 is not being used as an etching stop, the etching characteristics of the materials used for the dielectric interlayer 5 are not a crucial factor.

A further significant feature is that the first electrode 14 and the second electrode are formed in two separate etching operations, and since in this way the first electrode 14 and the dielectric interlayer 5 can be made wider than the second electrode 15. This means that short circuits between the first electrode 14 and the second electrode 15 scarcely occur and the breakdown strength is increased.

Finally, a further advantage of the layer structure is that the first antireflection layer 6 and the second antireflection layer 11 are not exposed to an etching operation before coating with the photoresist. This ensures that the antireflection layer 6 and the second antireflection layer 11 are undamaged. Accordingly, the exposure of the photoresist which has been applied to the antireflection layer 6 and the antireflection layer 11 can take place without undesirable reflections. This improves the quality of the patterning.

Unlike in the prior art, the first antireflection layer 6 and the second antireflection layer 11 are used for lithography immediately after they have been applied, without there being any residues of dielectric layers which impair the reflection characteristics of the first antireflection layer 6 and the second antireflection layer 11 during exposure.

In the embodiment shown in FIGS. 1 to 5, the first metalization layer 3 has a layer thickness of approximately 44 nm. This is followed by the first getter layer 4, with a layer thickness of 100 nm. In the adjacent interconnect 13, the layer thickness of the first getter layer 4 is only 50+/−30 nm, since the first getter layer 4, which is outside the capacitor stack, is etched down during the fabrication process. The 50 nm thick dielectric interlayer 5 is situated on the first getter layer 4. This is followed by the first antireflection layer 6, with a thickness of 33 nm. The layers 5 and 6 are present only in the capacitor stack 12. The layers above them, namely the second getter layer 7, with a thickness of 33 nm, the first antidegradation layer 8 with a thickness of 20 nm, the second metal layer 9 with a thickness of 400 nm and the second antidegradation layer 10 with a thickness of 10 nm and the second antireflection layer 11 with a thickness of 33 nm, are present both in the capacitor stack 12 and in the adjacent interconnect 13. This results in a height offset of only 133 nm between the capacitor stack 12 and the adjacent interconnect 13. However, a height offset of this type can be integrated without difficulty in a layer structure with a plurality of metal layers separated by interlayer dielectrics.

In the exemplary embodiment shown in FIGS. 1 to 5, the interlayer dielectric 1 and the interlayer dielectric 5 are formed from $SiO_2$ or SiN. For the first metalization layer 3 and the antidegradation layers 8 and 10, titanium is provided as the material: The getter layers 4 and 7 and the antireflection layers 6 and 11 are produced from TiN. Aluminum is provided for the second metal layer 9 and the first metal layer (not shown in FIGS. 1 to 5).

The materials listed are intended to be examples. Other materials are also suitable. Conductive materials, such as Si, W, Cu, Ag, Au, Ti, Pt and alloys thereof, are suitable for the metal layers and metalization layers. In addition to Ti and TiN, other suitable materials for the remaining layers are TiW, W, WNx where 0<x<2, Ta, TaN and silicides.

In addition to $SiO_2$, all other insulation materials, such as for example $Si_3N_4$, $Ta_2O_5$ can be used as dielectric layers. For the first interlayer dielectric 1 and the second interlayer dielectric 17, it is preferable to use $SiO_2$ or organic materials and materials with a low dielectric constant.

The layer structure illustrated in FIGS. 1 to 5 is distinguished by a high voltage linearity in the capacitors and low parasitic capacitances, allowing the capacitances to be accurately controlled. Therefore, the layer structure illustrated in FIGS. 1 to 5 is suitable in particular for applications in radio-frequency technology.

We claim:

1. An integrated component comprising a multiplicity of interconnects and a capacitor having a first electrode, a dielectric interlayer and a second electrode, said second electrode comprising a metal layer and an anti-reflection layer with the anti-reflection layer being disposed between the metal layer and the dielectric interlayer, the two electrodes of the capacitor together having a combined layer sequence which is identical to a layer sequence of the closest interconnect except for the anti-reflection layer.

2. An integrated component according to claim 1, wherein metalization layers which serve as electrodes of the capacitor have the same thicknesses as the metalization layers of the closest interconnect.

3. An integrated component according to claim 2, wherein all the layers which form the capacitor apart from the layer which lies below the dielectric interlayer of the capacitor have the same thicknesses as corresponding layers of the closest interconnects.

4. An integrated component according to claim 1, wherein the second electrode has a metal layer with a thickness of between 200 and 600 nm.

5. An integrated component according to claim 4, wherein the metal layer is produced from aluminum.

6. An integrated component according to claim 1, wherein the first electrode has a metal layer with a thickness of between 20 and 60 nm.

7. An integrated component according to claim 6, wherein the first electrode is produced from titanium.

8. An integrated component according to claim 1, wherein the first electrode is connected to a metal interconnect layer below it through vias.

9. An integrated component according to claim 1, wherein the second electrode is connected to a metal interconnect layer above it with the aid of vias.

10. A method for fabricating an integrated component which has a capacitor with a metal-insulator-metal layer sequence and interconnects, said method comprising depositing a first layer sequence for a first electrode of the capacitor on an interlayer dielectric; depositing a dielectric interlayer on the first layer sequence; etching to pattern the first layer sequence and the dielectric interlayer to form the first electrode and the insulator with the etching stopping in the first layer sequence; depositing a second layer sequence for a second electrode en of the capacitor and etching the second layer sequence and the first layer sequence down to the interlayer dielectric to pattern the second layer sequence to form the second electrode and interconnects.

11. A method according to claim 10, wherein the step of depositing the first layer sequence deposits a first metalization layer over an entire surface of the interlayer dielectric in which vias had been formed.

12. A method according to claim 11, wherein the step of depositing a the first layer sequence includes depositing a first barrier layer over the entire surface of the first metalization layer, the step of depositing the dielectric interlayer includes depositing the dielectric interlayer over the entire surface of the first barrier layer and then depositing an antireflection layer over the entire surface of the dielectric interlayer.

13. A method according to claim 12, wherein the step of etching to pattern the first layer sequence patterns the first barrier layer, the dielectric interlayer and the antireflection layer with the etching stopping at the first barrier layer in order to form a capacitor stack.

14. A method according to claim 13, wherein the step of depositing a second layer sequence includes applying a second barrier layer, a metal layer and a second antireflection layer to the antireflection layer of the first sequence.

15. A method according to claim 14, wherein the step of etching the second layer sequence etches the second barrier layer, the second-mentioned metal layer, the second antireflection layer and the first barrier layer down to the interlayer dielectric.

16. An integrated component according to claim 1, wherein the first electrode includes a metal layer and a barrier layer with the barrier layer being between the metal layer and the dielectric interlayer.

* * * * *